United States Patent
Fouli et al.

(10) Patent No.: US 11,108,705 B2
(45) Date of Patent: Aug. 31, 2021

(54) LINEAR NETWORK CODING WITH PRE-DETERMINED COEFFICIENT GENERATION THROUGH PARAMETER INITIALIZATION AND REUSE

(71) Applicant: CODE ON NETWORK CODING, LLC, Cambridge, MA (US)

(72) Inventors: Kerim Fouli, Cambridge, MA (US); Muriel Medard, Belmont, MA (US)

(73) Assignee: CODE ON NETWORK CODING, LLC, Cambridge, MA (US)

( * ) Notice: Subject to any disclaimer, the term of this patent is extended or adjusted under 35 U.S.C. 154(b) by 0 days.

(21) Appl. No.: 16/399,552

(22) Filed: Apr. 30, 2019

(65) Prior Publication Data

US 2020/0351220 A1 Nov. 5, 2020

(51) Int. Cl.
*H04L 12/931* (2013.01)
*H03M 13/00* (2006.01)
*H04L 12/24* (2006.01)
*H04L 12/935* (2013.01)

(52) U.S. Cl.
CPC ........ *H04L 49/35* (2013.01); *H03M 13/6502* (2013.01); *H03M 13/6522* (2013.01); *H04L 41/0806* (2013.01); *H04L 49/3009* (2013.01)

(58) Field of Classification Search
CPC ..... H04L 1/004; H04L 1/0041; H04L 1/0043; H04L 1/0045; H04L 1/0075; H04L 1/0076; H04L 1/0077; H04L 49/3009; H04L 49/35; H04L 41/08; H04L 41/0803; H04L 41/0806; H04L 2001/0097; H03M 13/6502; H03M 13/6522
See application file for complete search history.

(56) References Cited

U.S. PATENT DOCUMENTS

| | | |
|---|---|---|
| 6,885,653 B2 | 4/2005 | Choi et al. |
| 7,349,440 B1 | 3/2008 | Chou et al. |
| 7,408,938 B1 | 8/2008 | Chou et al. |
| 7,529,198 B2 | 5/2009 | Jain et al. |
| 7,706,365 B2 | 4/2010 | Effros |

(Continued)

FOREIGN PATENT DOCUMENTS

| | | |
|---|---|---|
| EP | 1612982 A2 | 1/2006 |
| EP | 2106073 A1 | 9/2009 |

(Continued)

OTHER PUBLICATIONS

B. Awerbuch, Y. Azar, and Y. Bartal. On-line generalized steiner problem. In Proceedings of the 7th Annual ACM-SIAM Symposium on Discrete Algorithms, 1996.

(Continued)

*Primary Examiner* — Peter Chen
(74) *Attorney, Agent, or Firm* — Steinfl + Bruno, LLP (57) ABSTRACT

A network node having a receiver for receiving input packets, a local node memory where one or more parameters for coding are stored, an encoder for creating coded packets from the input packets using linear network coding, and a transmitter to transmit the coded packets. Each coefficient of the linear network coding is a parameter of the one or more parameters or a pre-determined function of the one or more parameters. A related method and a network are also presented.

21 Claims, 8 Drawing Sheets

(56) References Cited

U.S. PATENT DOCUMENTS

| | | | |
|---|---|---|---|
| 7,756,051 | B2 | 7/2010 | Rodriguez et al. |
| 9,258,084 | B2 | 2/2016 | Zhovnirnovsky et al. |
| 9,699,104 | B2 | 7/2017 | Ho et al. |
| 9,979,666 | B2 | 5/2018 | Ho et al. |
| 10,554,569 | B2 | 2/2020 | Ho et al. |
| 2005/0010675 | A1 | 1/2005 | Jaggi et al. |
| 2005/0152391 | A1 | 7/2005 | Effros et al. |
| 2008/0291834 | A1 | 11/2008 | Chou et al. |
| 2009/0135717 | A1 | 5/2009 | Kamal et al. |
| 2009/0198829 | A1 | 8/2009 | Sengupta et al. |
| 2009/0207930 | A1 | 8/2009 | Sirkeci et al. |
| 2009/0238097 | A1 | 9/2009 | Le Bars et al. |
| 2009/0248898 | A1 | 10/2009 | Gkantsidis et al. |
| 2009/0285148 | A1 | 11/2009 | Luo et al. |
| 2009/0316763 | A1 | 12/2009 | Erkip et al. |
| 2011/0299526 | A1 | 12/2011 | Wu et al. |
| 2012/0039343 | A1 | 2/2012 | Kim et al. |
| 2012/0128009 | A1* | 5/2012 | Yang ............... H03M 13/2906 370/432 |
| 2014/0016469 | A1 | 1/2014 | Ho et al. |
| 2014/0146924 | A1 | 5/2014 | Shattil |
| 2015/0095739 | A1* | 4/2015 | Zhovnirnovsky ..... H04L 1/1819 714/759 |
| 2017/0264561 | A1 | 9/2017 | Ho et al. |
| 2018/0302332 | A1 | 10/2018 | Ho et al. |
| 2020/0136984 | A1 | 4/2020 | Ho et al. |

FOREIGN PATENT DOCUMENTS

| | | |
|---|---|---|
| EP | 2264930 A1 | 12/2010 |
| EP | 2360863 A1 | 8/2011 |
| WO | 2014/014761 A1 | 1/2014 |
| WO | 2014/074757 A2 | 5/2014 |

OTHER PUBLICATIONS

E. Izquierdo et al. "A Survey of Linear Network Coding and Network Error Correction Code Constructions and Algorithms" International Journal of Digital Multimedia Broadcasting. vol. 2011, Article # 85 784 7. Accepted May 16, 2011, 12 pages.

P. Berman and V. Ramaiyer. "Improved approximation algorithms for the steiner tree problem". Journal of Algorithms, 17; 381-408, 1994.

T. Ho, S. Jaggi, S. Vytrenko and L. Xia, "Universal and Robust Distributed Network Codes," Infocom 2011.

T. Noguchi, T. Matsuda, and M. Yamamoto. "Performance evaluation of new multicast architecture with network coding. IEICE Transactionson Communication", E86-B, No. 6, Jun. 2003.

Written Opinion for International Application No. PCT/US2013/050229 filed on Jul. 12, 2013 on behalf of Code on Network, LLC. dated Oct. 29, 2013. 10 pages.

Ahlswede et al., Network information Flow, IEEE Transactions on information theory and vol. 46, pp. 1204-1216 (2000).

B. M. Waxman. "Performance evaluation of multipoint routing algorithms." In Proceedings of IEEE INFOCOM,1993.

Chakrabarti, A.' et al. "Approximation Algorithms for the Unsplittable Flow Problem", Proceedings of the 5th International Workshop on Approximation Algorithms for Combinatorial Optimization, pp. 1-24 (Mar. 22, 2004).

D.S. Lun, N. Ratnakar, M. Medard, R. Koetter, D. R. Karger, T. Ho, and E. Ahmed, "Minimum-Cost multicast over Coded Packet Networks," IEEE Transactions on Information Theory, 52(6), pp. 2608-2623, Jun. 2006.

European Extended Search Report dated May 18, 2015 for EP Application No. 13819210 filed on Feb. 9, 2015 in the name of Code on Network Coding, LLC.

Final Office Action for U.S. Appl. No. 10/992,463, filed Nov. 17, 2004 on behalf of California Institute of Technology.dated Jun. 2, 2009. 8 pages.

Final Office Action for U.S. Appl. No. 13/940,703, filed Jul. 12, 2013 on behalf of Code on Network Coding, LLC. dated Feb. 22, 2016.

Fragouli et al., "Network Coding: An Instant Primer", ACM SIGCOMM, Computer Communication Review, vol. 36, No. 1, Jan. 2006. 6 pages.

Ho et al., "A Random Linear Network Coding Approach to Multicast", IEEE (2006). 18 pages.

Ho, T. et al, "On the utility of network coding in dynamic environments", International Workshop on Wireless AD-HOC Networks (IWWAN) I pp. 1-5 (2004).

International Preliminary Report on Patentability for International Application No. PCT/US2013/050229 filed on Jul. 12, 2013 on behalf of Code on Network, LLC. dated Jun. 23, 2014. 19 pages.

International Search Report for International Application No. PCT/US2013/050229 filed on Jul. 12, 2013 on behalf of Code on Network, LLC. dated Oct. 29, 2013. 4 pages.

K. Hao et al. "A New Deterministic Linear Network Coding and Its Application on Multicast Network" 5th International Conference on Wireless Communications, Networking and MobileComputing, 2009. WiCom '09. IEEE. Sep. 24-26, 2009, 4 pages.

Kodialam, M. et al, "Online Multicast Routing with Bandwidth Guarantees: A New Approach using Multicast Network Flow", Measurement and Modeling of Computer Systems, 11 pages total (2000).

Koetter, Medard et al., "An algebraic approach to network coding." IEEE/ACM transactions on networking, vol. 11 Issue 5,Oct. 2003.

Koetter, Medard et al., Beyond Routing; An algebraic approach to network coding. Proceedings of the 2002 IEEE Infocom (2002).

Koetter, Medard et al., "The Benefits of Coding over Routing in a randomized setting" international symposium on Information theory (ISIT)2003.

Kou, G. Markowsky and L. Berman, "A Fast Algorithm for Steiner Trees," Acta Informatica, vol. 15, No. 2, 1981.

Lee et al., Simplified Random Network Codes for Multicast Networks, M. Eng. Thesis, MIT, May 2005.

M. Charikar, C. Cheruki, T. Cheung, Z. Dai, A. Goel, S. Guha, and M. Li. Approximation algorithms for directed steiner problems. In proceedings of the 9th ACM-SIAM Symposium on Discrete Algorithms,1998..

M. Karpinsky and A. Zelikovsky. "New approximation algorithms for the steiner tree problem." In Technical Report, Electronic Colloquiumon Computational Complexity (ECCC) TR95-030, 1995.

Network Coding: An Introduction, Cambridge University Press New York, NY, USA (2008),ISBN: 052187310X9780521873109.

Non-Final Office Action for U.S. Appl. No. 10/992,463, filed Nov. 17, 2004 on behalf of California Institute of Technology. dated Oct. 23, 2007..

Non-Final Office Action for U.S. Appl. No. 10/992,463, filed Nov. 17, 2004 on behalf of California Institute of Technology. dated Oct. 27, 2008..

Non-Final Office Action for U.S. Appl. No. 10/992,463, filed Nov. 17, 2004 on behalf of California Institute of Technology. dated Mar. 17, 2008. 7 pages.

Non-Final Office Action for U.S. Appl. No. 13/940,703, filed Jul. 12, 2013 on behalf of Code on Network Coding, LLC. dated Aug. 13, 2015.

Non-Final Office Action for U.S. Appl. No. 13/940,703, filed Jul. 12, 2013 on behalf of Code on Network Coding, LLC. dated Sep. 7, 2016.

Non-Final Office Action for U.S. Appl. No. 15/609,856, filed May 31, 2017 on behalf ofCODE on Network Coding, LLC.dated Sep. 8, 2017.

Non-Final Office Action for U.S. Appl. No. 15/958,178, filed Apr. 20, 2018 on behalf of Code on Network Coding, LLC. dated Jun. 26, 2019.

Notice of Allowance for U.S. Appl. No. 10/992,463, filed Nov. 17, 2004 on behalf of California Institute of Technology. dated Jan. 14, 2010..

Notice of Allowance for U.S. Appl. No. 13/940,703, filed Jul. 12, 2013 on behalf of Code on Network Coding, LLC. dated Mar. 2, 2017.

(56) References Cited

OTHER PUBLICATIONS

Notice of Allowance for U.S. Appl. No. 15/609,856, filed May 31, 2017 on behalf of Code on Network Coding, LLC. dated Jan. 22, 2018.
Notice of Allowance for U.S. Appl. No. 15/958,178, filed Apr. 20, 2018 on behalf of Code on Network Coding, LLC. dated Oct. 1, 2019.
P. Sanders, S. Egner, and L. Tolhuizen, "Polynomial Time Algorithms for Network Information Flow", In 15th ACM Symposium on Parallel Algorithms and Architectures, pp. 286-294, 2003.
P.A. Chou, Y. Wu, and K. Jain. Practical network coding. In Proceedings of 41st Annual Allerton Conference on Communication, Control, and Computing, Oct. 2003..
S. Jaggi, P.A. Chou and K. Jain, "Low Complexity Algebraic Network Codes", Proceedings of the 2003 IEEE International Symposium on Information Theory.
S. Ramanathan et al, Multicast tree generation in networks with asymmetric links. IEEE Transactions on Networking,Aug. 4, 1996.
S.D. Servetto, G. Barrenechea. "Constrained Random Walks on Random Graphs: Routing Algorithms for Large Scale Wireless Sensor Networks", Proceedings of the 1st ACM International Workshop on Wireless Networks and Applications, 2002.
S.-Y.R. Li and R.W. Yeung, "Linear Network Coding", IEEE Transactions on Information Theory, vol. 49, pp. 371-381. 2003.
T. Ho, D. R. Karger, M. Medard and R. Koetter, "Network Coding from a Network Flow Perspective", Submitted to the 2003 IEEE International Symposium on Information Theory.
T. Ho, M. Medard, J. Shi, M. Effros, and D. R. Karger. "On randomized network coding." In Proceedings of 41st Annual Allerton 'Conference onCommunication, Control, and Computing, Oct. 2003.
Y. Zhu, B. B Li, and J. Guo. "Multicast with network coding in application layer overlay networks." IEEE Journal on Selected Areas in Communications, 22(1), 2004.
Communication under Rule 71(3) EPC dated Jan. 28, 2020 for EP Application No. 13819210 filed on Feb. 9, 2015 in the name of Code on Network Coding, LLC. 26 Pages.
Decision to grant a European patent pursuant to Article 97(1) EPC dated Aug. 6, 2020 for EP Application No. 13819210 filed on Feb. 9, 2015 in the name of Code On Network Coding, LLC. 2 Pages.
International Search Report for International Application No. PCT/US2020/020427 filed on Feb. 28, 2020 on behalf of Code on Network Coding LLC dated Jul. 27, 2020 3 pages.
Written Opinion for International Application No. PCT/US2020/020427 filed on Feb. 28, 2020 on behalf of Code on Network Coding LLC dated Jul. 27, 2020 7 pages.
International Preliminary Report on Patentability (Chapter II) for International Application No. PCT/US2020/020427 filed on Feb. 28, 2020 on behalf of Code On Network Coding, LLC dated Jun. 2, 2021 10 pages.
Notice of Allowance for U.S. Appl. No. 16/726,001, filed Dec. 23, 2019, on behalf ofCode On Network Coding, LLC. dated Apr. 9, 2021. 18 Pages.
Second Written Opinion for International Application No. PCT/US2020/020427 filed on Feb. 28, 2020 on behalf of Code On Network Coding LLC dated Mar. 29, 2021 6 pages.

\* cited by examiner

|  | $Y(3)$ | $Y(4)$ |
|---|---|---|
| multivariate | $a_{1,3}X + f_{1,3}Y(1) + f_{2,3}Y(2)$ | $a_{1,4}X + f_{1,4}Y(1) + f_{2,4}Y(2)$ |
| multivariate broadcast | $a_1X_1 + f_1Y(1) + f_2Y(2)$ | $a_1X_1 + f_1Y(1) + f_2Y(2)$ |
| univariate | $X_1 + \alpha Y(1) + \alpha Y(2)$ | $X_1 + \alpha Y(1) + \alpha Y(2)$ |

| Node | Coded Packet | Expression | Vector $[p_1, p_2, p_3]$ |
|---|---|---|---|
| n1 | c1 | $p_1 + \alpha\, p_2$ | [1,3,0] |
| | c2 | $2\alpha\, p_1 + 3\alpha\, p_2 + 4\alpha\, p_3$ | [6,9,12] |
| n2 | c3 | $p_1 + \alpha\, p_3$ | [1,0,3] |
| | c4 | $2\alpha\, p_1 + 3\alpha\, p_3 + 4\alpha\, c_2$ | [30,12,1] |

*Fig. 10*

LINEAR NETWORK CODING WITH PRE-DETERMINED COEFFICIENT GENERATION THROUGH PARAMETER INITIALIZATION AND REUSE

BACKGROUND

Linear network coding is a process that applies linear coefficients to inputs in order to derive a coded output. Linear network coding is a method applied in data transport and storage network nodes to enable communication and improve efficiency, whereby nodes in a data network function as encoders and decoders.

In particular, a node operating as an encoder does not just forward (i.e. relay or replicate) information received from an input link, it also encodes such information. Coding at a node in a network is known as network coding. Networks can be modeled as graphs with directed links, one or more sources, and one or more receivers, as shown in R. Koetter and M. Medard, "An algebraic approach to network coding." IEEE/ACM Trans actions on Networking, Vol 11 Issue 5, October 2003, incorporated herein by reference in its entirety. A common communication problem in networks is the multicast connection problem, where source data has to be transmitted to each of the receiver nodes.

Network coding enables connections that are not possible if limited to forwarding. In particular, it has been shown in R. Ahlswede, N. Cai, S.-Y. R. Li, and R. W. Yeung, "Network Information Flow, IEEE Transactions on Information Theory and vol. 46, pp. 1204-1216 (2000), incorporated herein by reference in its entirety, that it is, in general, not optimal to simply route or replicate the information to be transmitted. Rather, by employing coding at the nodes, bandwidth can generally be saved.

A network can be represented as a directed graph, as shown in R. Koetter and M. Medard, "Beyond Routing: An Algebraic Approach to Network Coding'. Proceedings of the 2002 IEEE Infocom (2002), incorporated herein by reference in its entirety. The graph comprises source nodes and receiver nodes, where data is transmitted from the source nodes to the receiver nodes. In the above reference, an algorithm for finding a linear coding solution to a given multicast connection problem, using knowledge of the entire network topology, is disclosed.

However, in applications where communication is limited or expensive, it may be preferable to determine each node's behavior in a distributed manner. Determination of node behavior in a distributed manner is based on information available locally at each node and/or minimal control signaling, without requiring centralized coordination or knowledge of the overall network topology. It has been shown in T. Ho, R. Koetter, M. Medard, D. R. Karger and M. Effros, "The Benefits of Coding over Routing in a Randomized Setting." International Symposium on Information Theory (ISIT) 2003, incorporated herein by reference in its entirety, that the multicast connection problem can be solved in a distributed manner by means of random linear network coding.

In the above reference, linear network coding uses random coefficient generation on data flows, where a node combines flows linearly by assigning a random coefficient to each flow. A coefficient is defined here as an element from a finite field that is associated with a given data flow as its multiplier, where the addition of thus multiplied data flows forms a linear combination of flows (i.e., a coded flow).

The random, or arbitrary, selection of coefficients can be made in a dynamic or predetermined fashion. The use of pre-determined code constructions can simplify network operation. Pre-determined code constructs were suggested as simplified codes to solve the multicast connection problem in wireless multicast networks, see Anna H Lee, Simplified Random Network Codes for Multicast Networks, M. Eng. Thesis, MIT, May 2005 (hereinafter Lee), incorporated herein by reference in its entirety.

SUMMARY

In a first aspect of the disclosure, a network node is described, comprising: a receiver for receiving input packets, local node memory where one or more parameters for coding are stored, an encoder for creating coded packets from the input packets using linear network coding, wherein each coefficient of the linear network coding is a parameter of the one or more parameters, or a pre-determined function of the one or more parameters, and a transmitter to transmit the coded packets.

In a second aspect of the disclosure, a method for processing packets input to a network node is described, comprising reading one or more parameters from a local memory, determining whether a coded packet is required, reusing stored parameters to generate one or more coefficients required for linear network coding, and creating coded packets from input packets using the generated one or more coefficients, wherein each of the one or more coefficients is a parameter from among the one or more parameters, or is generated from the one or more parameters through one or more pre-determined functions.

BRIEF DESCRIPTION OF DRAWINGS

The accompanying drawings, which are incorporated into and constitute a part of this specification, illustrate one or more embodiments of the present disclosure and, together with the description of example embodiments, serve to explain the principles and implementations of the disclosure.

DETAILED DESCRIPTION

Embodiments of the present disclosure are directed at simplifying mass-produced nodes (e.g., sensor nodes) by including a simple code in a node's pre-programmed routines or through node initialization. This simplifies both node operation—for example by eliminating random coefficient generation- and the node design process, by including a pre-programmed code.

The methods described herein are not limited by a single variable or coefficient. They are rather characterized by a limited number of variables that are pre-programmed (hard-wired or programmed) or initially distributed to the nodes. They are also characterized by the absence of randomness in the process of selecting the network coding coefficients, hence their pre-determined qualification.

Linear coding can be applied to flows or data units, where flows are sequences of data units with the same routing characteristics (e.g., typically they have similar addressing information).

Each data unit is a set of bits. Linear coding typically applies to equal-sized sets of bits called symbols. The symbol-size is dependent on the field-size where the coding is applied. This document assumes adequate conversion between data units and symbols, a process that resides within the encoding and decoding modules and that typically involves padding, segmentation, and header generation. The methods described herein are independent of the field size.

Although the present disclosure uses the terms "data unit" and "packet" interchangeably, the methods described herein are applicable to data units at any layer, including physical and data link frames, network-layer packets, transport-layer segments, or application-layer data units and bit stream subdivisions. In storage applications, data units typically represent file chunks or disk sectors. Furthermore, the methods described herein can be applied through software or hardware.

Inter-flow network coding is the application of network coding between flows, where coefficients are assigned to flows rather than their constituent data units. Intra-flow network coding is the application of network coding within flows, where coefficients are assigned to individual data units. In intra-flow linear coding, a coefficient is defined as an element from a finite field that is associated with a given data unit (e.g., packet) as its multiplier, where the addition of thus multiplied data units forms a linear combination of data units (i.e, a coded data unit).

The methods described herein cover intra-flow coding through a limited number of parameters that may need to be reused by a node in order to generate coefficients for each data unit. The reuse of parameters is carried out at the nodes through coefficient-generating functions. The parameters and coefficient-generating functions are either pre-programmed at device manufacturing or input to the node during a node or network initialization processes. Codes employing a limited set of parameters and functions are described herein as thrifty codes.

Thrifty codes are linear network codes that avoid the use of an online pseudo-random number generator in coefficient generation. Instead, parameters and pre-determined functions are used at the nodes to generate coefficients. Thrifty codes reduce the complexity of the encoding process a node needs to carry out, by reducing the number of operations that are required to generate coding coefficients. This reduces the energy usage of the node.

Thrifty codes can be deployed at individual communication nodes as a simple means of implementing Random Linear Network Coding (RLNC). Applications include all systems that transport or store data, including backbone communication and wide area (WAN) networks, optical networks, satellite networks, access and metropolitan (MAN) networks, wireless cellular and mobile networks, local-area networks (LAN), home networks, personal area networks (PAN), body area networks, storage area networks (SAN), cloud networks, enterprise storage networks, data center systems and server arrays, etc. In particular, the reduction of complexity and energy usage facilitates the deployment of thrifty codes in systems and networks using the small-footprint devices, as described below.

The term "node" represents any communicating element of a wireless or wired communication infrastructure, including Bluetooth, WiFi, cellular (e.g., LTE), servers and data-center systems, backbone and access routers, cloud computing nodes, and network interface cards (NIC) for vehicular, industrial, satellite, and computer networks. In particular, nodes can be implemented within various consumer electronic devices such as personal computers, computer products, laptops, phones, tablets, etc. The methods described herein are particularly attractive for mass-produced small-footprint devices due to the sensitivity of such devices to cost, power consumption, and complexity. Such devices include devices used in sensor systems, home networks, Internet of Things (IoT) networks, embedded systems, mesh networks, mobile ad-hoc networks (MANETs), mobile systems, cellular networks, small form factor (SFF) systems, and any device requiring low power consumption, using low-cost transceiver microchips, or having low computational capability. Thus in the present disclosure, the term "node" refers to a base station, a mobile terminal, a personal computer, or similar electronic devices capable of processing data, where these devices are capable of being networked and communicate with each other.

The present application may be related to U.S. Pat. Nos. 9,699,104 and 9,258,084, both of which are incorporated herein by reference in their entirety. While U.S. Pat. No. 9,699,104 does not specify a method for generating coefficients at the nodes, this application provides concrete embodiments for creating coefficients and generating coded data units at the nodes.

Contrary to U.S. Pat. No. 9,258,084, no codebook is generated or used at system start up in this application. Furthermore, unlike U.S. Pat. No. 9,258,084, this application does not require nodes to use a single function that is universally known throughout the network. Rather, different functions can be used, and no coordination in function definition is needed between nodes. In addition, this application requires functions to use and reuse a limited number of parameters for coefficient generation at the node.

Lee, already briefly described in the background section of the present application. presents a single-coefficient ("univariate") code construct for network coding in a distributed multicast wireless setting. The term "univariate" refers to a code using a single variable. In Lee, the single variable required for coding is the coefficient $\alpha$; The principle is that all nodes use the same (pre-programmed) coefficient ($\alpha$) for network coding. In reality, Lee proposes to use the unit coefficient (1) for locally generated flows and the pre-programmed coefficient $\alpha$ for all incoming flows, hence creating a measure of coefficient diversity. (See, for example, FIG. 1).

Lee explicitly recognizes coefficient diversity as a limiting factor of univariate codes, since a lack of coefficient diversity results in linear dependency at the receivers and an inability to decode, leading to non-viable codes. Lee explores other diversity paradigms. For example, code diversification is explored by introducing a second parameter (f) representing a fraction of flows to be assigned the unit coefficient. Lee also explores the code efficiency of different coefficient values for different odd and even finite field sizes.

Lee focuses exclusively on solving the multicast connection problem, where the network is modeled as a set of multicast sources, sinks and intermediate nodes vehiculating information flows. Therefore, the model considers only inter-flow network coding, where nodes combine incoming (and local) flows to form outgoing flows, and network coding is applied at the flow level.

Figure 1:
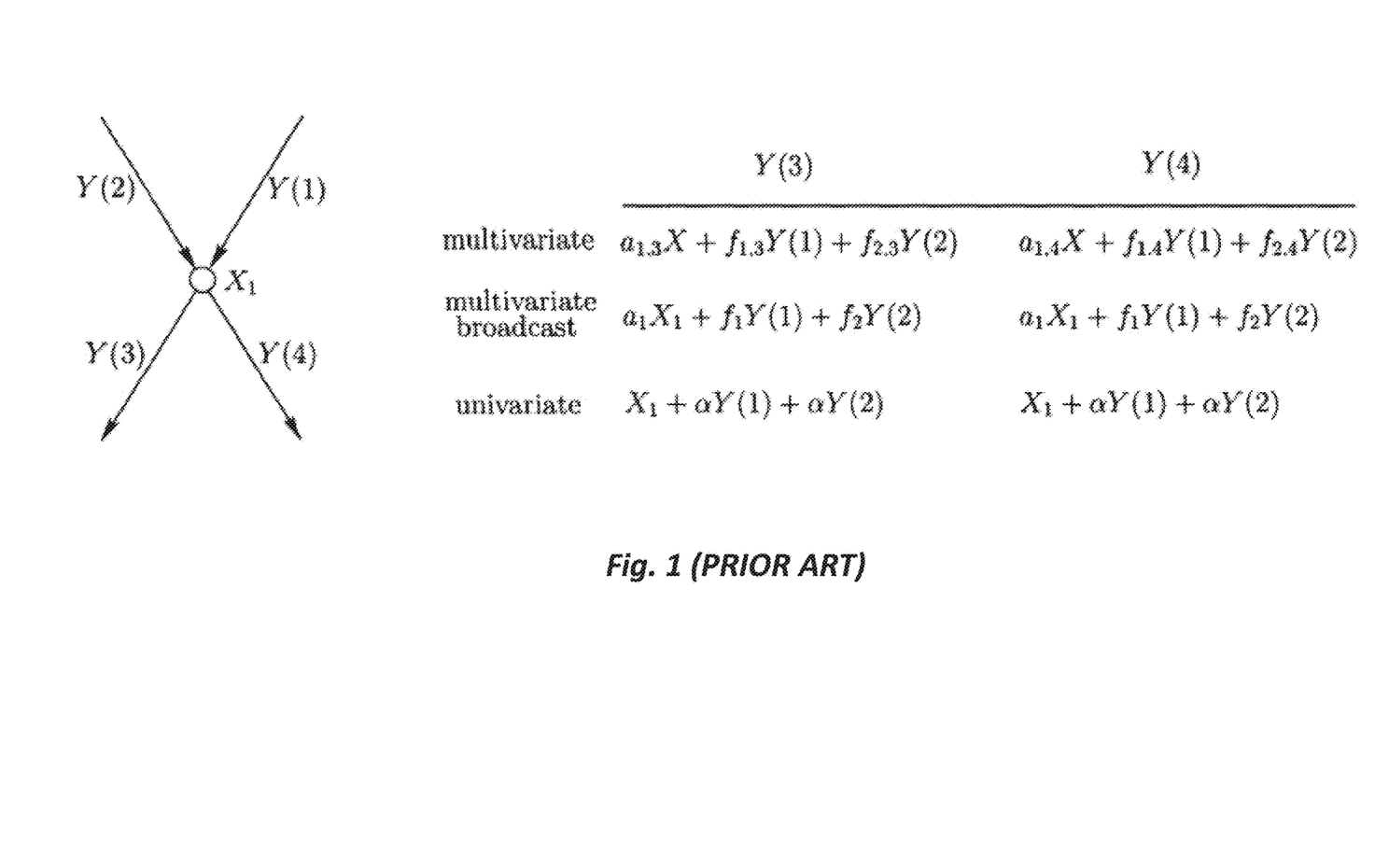
FIG. 1 shows a prior art example of univariate code in an inter-flow network coding setting.

In particular, FIG. 1 (reproduced from Lee) shows an example of univariate code in an inter-flow network coding setting. In this example, a node combines input and local signals, or flows, using linear coding. The table in FIG. 1 shows the coefficients used in the linear combination. The coefficients used for input signals and local signals are a and 1, respectively.

Lee does not consider intra-flow network coding, the process of coding individual data units (e.g., packets) of the same flow.

Intra-flow network coding has shown significant efficiency and performance advantages, particularly for packet erasure/error correction, latency reduction, multicasting, multipath operation, and mesh networking.

Intra-flow network coding has wide-range applications and benefits in networks involving small form factor devices, ranging from energy savings to network efficiency and robustness.

The methods described herein extend the "univariate" concept depicted by Lee to intra-flow network coding. They present embodiments that are also motivated by code simplicity, with codes that are easy to mass-program and that are more adequate for smaller devices (e.g., sensors) and devices with computational constraints.

Parameter Initialization and Reuse

Parameters are members of a finite field that are stored in the node's memory at node initialization, where initialization is defined as a process by which a node becomes operational in the network.

The number of parameters and functions should be limited so as to streamline node production, and to reduce memory usage and the complexity of coefficient calculation. The use of one parameter and one function would be ideal. However, the provision of more than one of each may be necessary for coefficient diversity.

Initialization consists in pre-programming all nodes with a limited number of parameters. Initialization also includes pre-programming each node with a limited number of functions to be used to generate coefficients from the parameter(s). In a different embodiment, a central authority (e.g., network controller or network management unit) can distribute/disseminate the parameter(s) and the function(s) to the nodes prior to communication (e.g., network setup, node discovery, etc.). Alternatively, all nodes can be programmed to select their own parameters from information that is available to the node at the time of initialization (e.g., use a portion or the entirety of a hardwired node parameter such as a serial number, a network address, etc.).

Parameter reuse refers to the repeated use of the same parameter or parameters to generate multiple coefficients. Each coding operation leads to the creation of one coded packet. A node will reuse its parameter(s) at each coding operation to generate coding coefficients for each of the data units (e.g., packets) to be coded, where each coefficient is a parameter or a function thereof.

Each coding operation (i.e., the creation of one coded packet) typically requires multiple coefficients. If the function used to create the coefficients is a sequence (e.g., an arithmetic or geometric sequence), it can either be re-initialized at each new coding operation or continued (e.g., continuing to the next multiple or power of the parameter). In one embodiment, the function can be reinitialized for each distinct stream of packets (e.g., a video).

Coefficients are generated from the parameters using a pre-determined function. The pre-determined function is a mathematical function or algorithm that may be stored in the node's memory (e.g., as part of its programmed software). It is known by the node since node initialization.

Both the function and the parameters may have been received from the network (e.g., central node) or selected locally. Parameters and functions may be subsequently modified, but this occurs occasionally as a network management event (i.e., not at the frequency of incoming packets).

Figure 2:
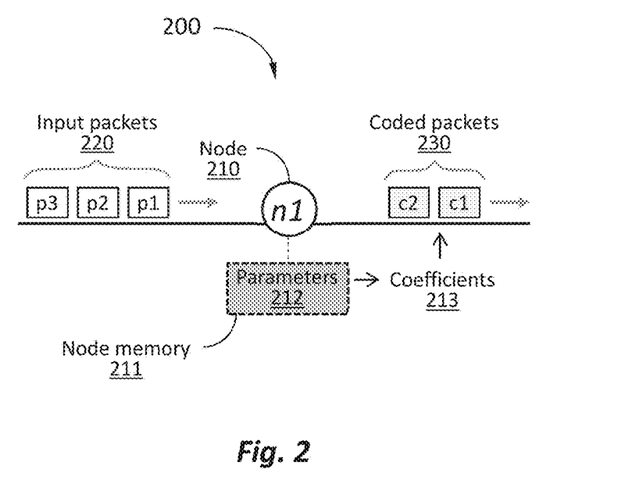
FIG. 2 shows parameter reuse according to an embodiment of the present disclosure.

Reuse is illustrated in FIG. 2 (200), where Node n1 (210) generates coded packets c1 and c2 (230) from input packets p1, p2, and p3 (220). The parameters are stored in the node's local memory (212).

Each time a new coefficient is needed, the stored parameters (212) are reused by the node (210) to generate the new coefficient (213).

Coefficients (213) may take the form of a mathematical sequence of numbers generated by the function using the parameters. For example, each coefficient (except for an initial set of one or more coefficients) may be a function of one or more previous coefficients. The previous coefficients (213) required to generate the next coefficient may therefore need to be stored temporarily, until the next coefficient is generated.

Figure 3:
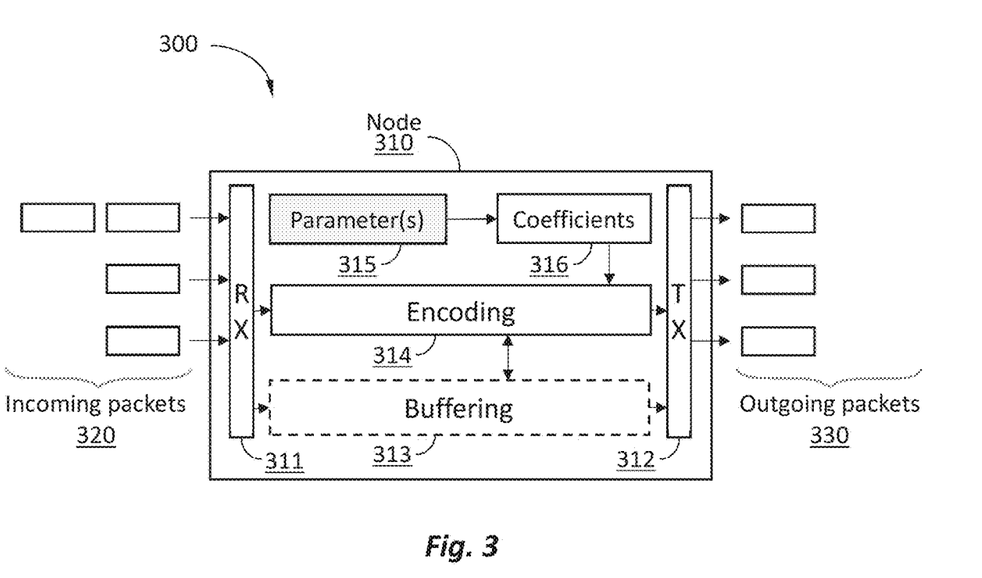
FIG. 3 shows an architecture of the node of FIG. 2.

FIG. 3 shows a possible embodiment (300) of the architecture of a node (310) reusing one or more parameters for the purposes of linear network coding. The parameters are stored in the node's local memory (315).

Incoming packets (320) arrive to the node from different input ports via a receiver unit (RX) (311). They are then buffered for coding and retransmission at a buffering unit (313). When coding is required, coefficients (316) are generated from the stored parameters (315) and used at the encoding unit (314) in order to generate coded packets. Coded packets are then buffered at the buffering unit (313) for transmission via the transmission unit (TX) (312) to the output ports. Outgoing packets (330) may contain coded and uncoded packets.

Received packets may be sent directly from the receiver unit to the encoding unit or from the encoding unit to the transmission unit, without buffering. Also, although not represented, the mapping of each outgoing packet to one or more output ports (i.e., switching or multicasting) may be carried out at the transmission unit (TX).

The example of a sensor node can be used to illustrate the architecture of FIG. 3. In addition to their power source and sensors, sensor nodes contain a central controller unit that is typically implemented using a microcontroller, although some sensor designs use general purpose microprocessors, digital signal processors, FPGAs, or ASICs. Sensor nodes also use a radio, infrared, or optical transceiver for communication purposes. Their external memory is usually a flash memory (i.e., electronic solid-state non-volatile computer storage). With reference to FIG. 3, the encoding unit (314) may be implemented at the sensor node's controller unit. The local memory containing the parameters (315) and coefficients (316) may correspond to the sensor node's on-chip microcontroller memory. The buffering unit (313) may be part of the node's external memory. The transceiver combines the functionalities of the transmitter (312) and receiver (311) units.

Examples of Parameter Reuse

Figure 4:
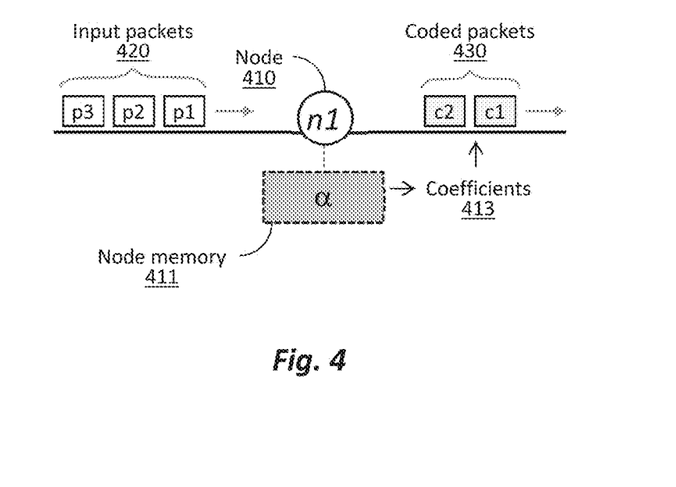
FIG. 4 shows parameter reuse according to a further embodiment of the present disclosure.
Figure 5:
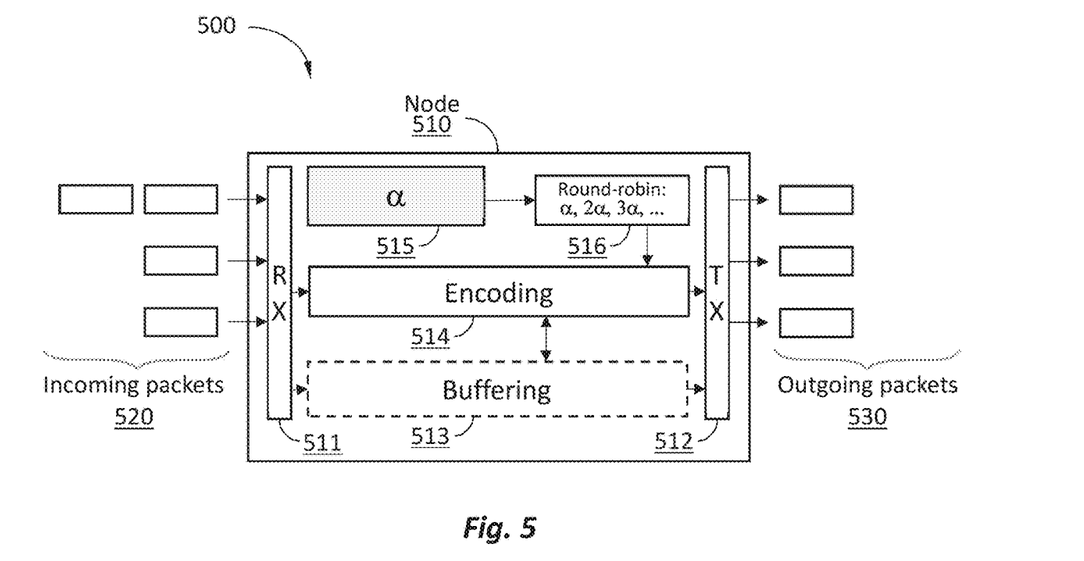
FIG. 5 shows an architecture of the node of FIG. 4.

An example of parameter reuse is given in FIGS. 4 and 5. In FIG. 4 (400), node n1 (410) generates coded packets c1 and c2 (430) from input packets p1, p2, and p3 (420). Node n1 uses α as a pre-determined parameter, where α is a member of finite field $F_q$ and q is a field size. Parameter α is stored in the node's local memory (411).

To generate coefficients (413), n1 may generate a sequence C(i) of numbers from $F_q$ through the function $g_1$ listed below.

$$C(i)=i\alpha[q] \qquad g_1:$$

where i>=1 is an index and [.] is the modulo operator.

In the present disclosure, it is assumed that functions skip the zero coefficient. This can be done by automatically replacing zero by a fixed number (e.g., one) in coefficient calculation.

FIG. 5 (500) shows a possible embodiment of the architecture. The parameter α is stored in the node's local memory (515). Incoming packets (520), arriving to the node from different input ports via a receiver unit (RX) (511), are buffered for coding and retransmission at a buffering unit (513). When coding is required, a batch of coding coefficients is generated from the stored parameter (515) and the previous coefficient (516) using function $g_1$. These coefficients are used at the encoding unit (514) in order to generate coded packets.

In a simple implementation, the node loops through the finite field $F_q$ by using parameter α (515) as the first coefficient and creating new coefficients by adding α to the previous coefficient. The generated coefficients are the members of the set {α, 2α, 3α, . . . }. The latest value of the previous coefficient may be stored in the coefficient module (516).

Coded packets are then buffered at the buffering unit (513) for transmission via the transmission unit (TX) (512) to the output ports.

In the example of FIGS. 4 and 5, the fixed parameter α is reused by the node to generate coefficients.

Sample Flow Chart

Figure 6:
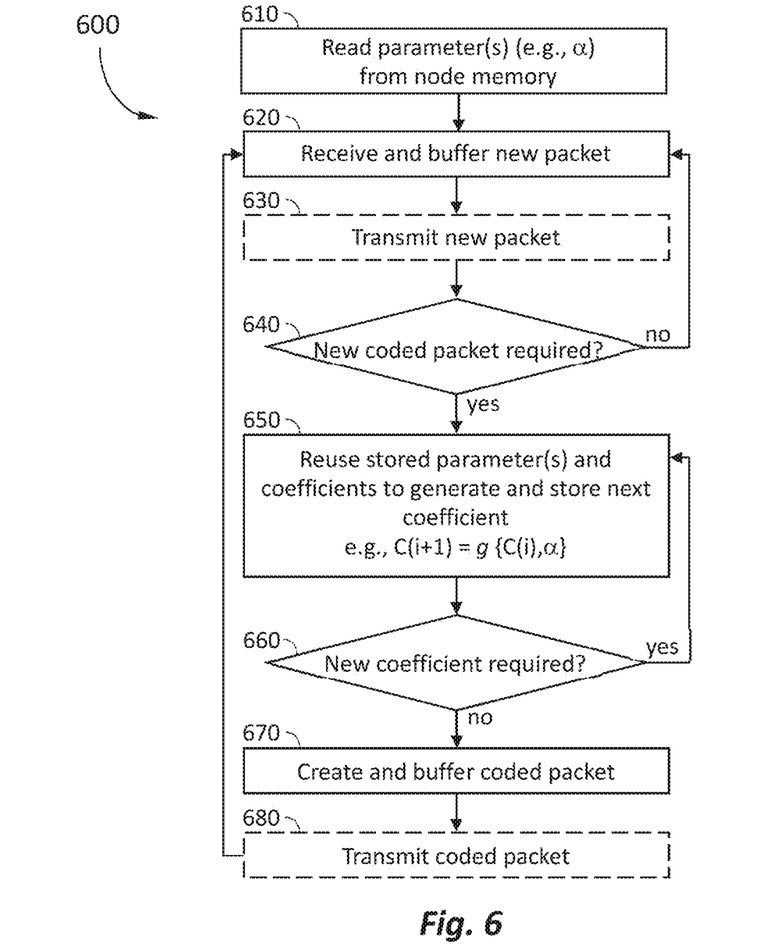
FIG. 6 is a flowchart showing a possible sequential set of the operations conducted by the node of the previous figures.

The flow chart (600) in FIG. 6 illustrates a possible embodiment of the operations conducted by the node.

At node initialization, the node reads (610) the parameter(s) from its memory in preparation for the coding process. The node then waits for incoming packets.

Each time a new packet is received, buffered (620), and (optionally) transmitted (630), a decision step (640) is triggered where the node determines whether a new coded packet is required. If no coded packets are required, the node returns to waiting for incoming packets.

If a coded packet is required, the node reuses (650) the stored parameter(s) and previous coefficient(s), if any, in order to generate the next coefficient. In other terms, the first coefficient is a function of the node's parameters. All subsequent coefficients may be a function of previous coefficients as well as node parameters (e.g., the sequence code of FIG. 5).

The creation of one coded packet typically requires more than one coefficient, as the creation of a coded packet requires one coefficient for each original/native packet that is input to the encoding unit. For example, if a set of B buffered packets are selected for coding, then the creation of each coded packet from that input set of packets requires B coefficients.

The process (650) of generating one more coefficient is therefore repeated as long as new coefficients are required (660) to create the coded packet. Once a sufficient number of coefficients is generated, the coded packet is created, buffered (670), and optionally transmitted (680). The node then returns to waiting for incoming packets.

In an alternative embodiment, rather than packet arrivals, the decision step (640) may be triggered by factors that are internal to the node, such as timing constraints (e.g., a regular periodic trigger), an estimation of packet losses over the network, or external factors such as protocol feedback (e.g., request for a coded packet, information about packet losses).

The embodiments of FIGS. 3, 5, and 6 may be entirely software-based nodes that are implemented using field-programmable gate arrays (FPGA) or soft radios, for example.

Alternatively, hardware-based node designs (e.g., implemented using dedicated Application-specific integrated circuits (ASIC)) or a combination of dedicated and programmable chips are possible.

Other Examples

Figure 7:
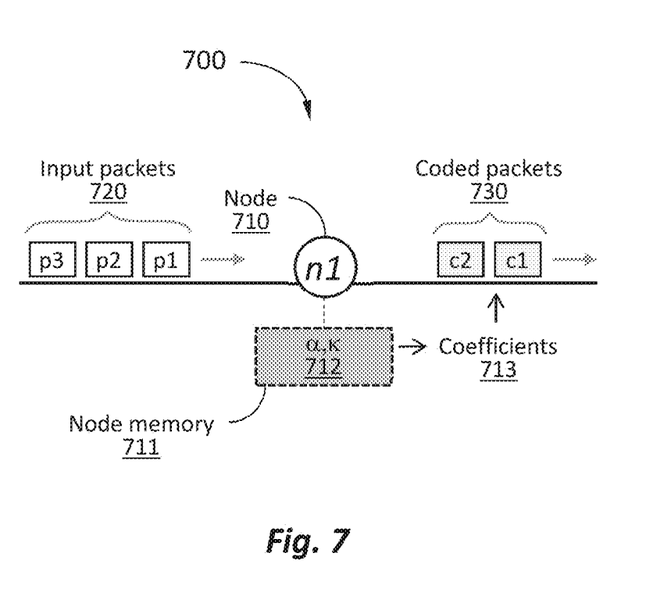
FIG. 7 shows multiple parameter reuse according to a further embodiment of the present disclosure.

Nodes can have more than one parameter. This is illustrated in FIG. 7 (700). Node n1 (710) generates coded packets c1 and c2 (730) from input packets p1, p2, and p3 (720). Node n1 uses two parameters α and κ (712), where α and κ are members of finite field $F_q$ and q is a field size. Parameters α and κ are stored in the node's local memory (711). To generate coefficients, n1 may generate a sequence C(i) of numbers from $F_q$ through the function $g_2$ listed below.

$$C(1)=\alpha$$

$$C(i+1)=\{C(i)+\kappa\}[q], \qquad g_2:$$

where i>=1 is an index and [.] is the modulo operator.

The function $g_2$ therefore loops through the finite field by adding a constant κ to the previous coefficient, starting from α. The generated coefficients are the members of the set {α, α+κ, α+2κ, α+3κ, . . . }. In other words, $g_2$: C(i)=α+(i−1)κ [q], i>=1.

Figure 8:
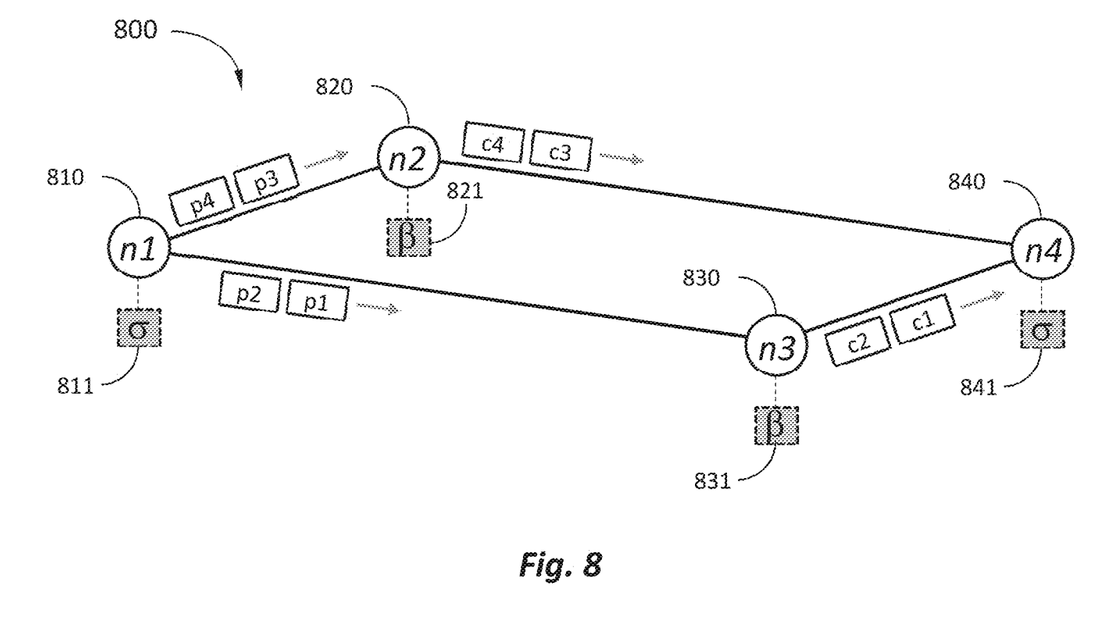
FIG. 8 shows an exemplary network according to the present disclosure with different parameters across the network nodes.

The parameters (α,κ) are hence reused by the node to generate coefficients. FIG. 8 is an example showing that parameters and functions may be different across the network nodes. FIG. 8 represents a mesh network (800) where four nodes, n1 (810), n2 (820), n3 (830), and n4 (840), use distinct parameters. While n1 and n4 were initialized with parameter α (811, 841), n2 and n3 were initialized with parameter β (821, 831).

Functions may also differ. In FIG. 8, n2 may use function $g_1$, leading to coefficients {β, 2β, 3β, . . . } whereas n3 may use function $g_2$ with κ=1, leading to coefficients {β, β+1, β+2, . . . }.

Examples of "Thrifty" Codes

Single-coefficient code: A single-coefficient code is the simplest thrifty code to implement. It uses a single parameter α as the sole coefficient for any coding operation, as in FIG. 4. However, unlike FIG. 5, for each new coded packet to be created, it may assign the single coefficient α to all packets to be coded. This code may have limited applicability due to its expected lack of diversity (i.e., a high likelihood of linear dependence among coded packets).

Coefficient-set code: In this thrifty code, the parameters are taken as predetermined coefficients, without further computation. The function assigns coefficients selected directly from the parameter set (e.g., FIG. 7, where the node has two parameters). For example, the function can assign coefficients from the stored list of parameters in a round-robin fashion, selecting the next parameter as the coefficient of the next packet to be encoded, and going back to the start of the list of parameters each time the list is traversed yet more coefficients are needed. Alternatively, the function can map parameters based on a definition of subsets among packets to be encoded. For example, a function within a node with parameters α and κ (as in FIG. 7) may categorize packets to be encoded into two categories: arriving packets and previously buffered packets. The function may then use coefficient α for incoming packets and coefficient κ for buffered packets.

Sequence code: A sequence code uses one or more parameters as an input to a mathematical sequence (e.g., arithmetic or geometric sequence). For example, a single-parameter function can assign powers of α (1, α, $α^2$, $α^3$, etc.) or multiples of α (1, α, 2α, 3α, etc.) to the packets to be encoded. (The latter sequence code is illustrated in FIG. 5.) In the flow diagram of FIG. 6, a sequence code is given as an example of the parameter reuse step (650). Naturally, sequences may be defined using more than one parameter (e.g., see FIG. 7 with function $g_2$ defined above).

Codes can borrow elements from sequence and coefficient-set codes. For example, a function may use 1 on incoming packets and compute the next element of a sequence as a coefficient for buffered packets (e.g., packets located in the buffering unit (313) of a node).

The allocation of coefficients may be affected by coding complexity or node buffering policy. For example, a node may buffer (313) only coded packets, since coded packets offer a more diverse representation of the data than uncoded packets. In the recoding of coded packets (i.e., the re-encoding of a coded packet), a function may select a coefficient for a coded packet based on the number of uncoded packets that were combined to create that coded packet (i.e., its density). The objective here may be the reduction of coding complexity (e.g., the number of field operations required for the coding process). For example, dense packets may be more likely to be assigned coefficient 1 than sparse or uncoded packets. Hence, a node that buffers (313) both coded and uncoded packets may use distinct coefficient sets when picking packets from one category or the other, based on considerations such as complexity.

Composite function codes: The most general description of a thrifty code is a code that employs a pre-programmed function and a limited number of pre-programmed parameters (713) to generate coefficients (714) for linear coding, where the function definition may vary with each coefficient generation. For each coded packet to be created, the function generates one coefficient for each packet to be encoded, based on the parameters. In a composite function code, the function itself can be reused as a sequence element. Furthermore, it can be defined through different parameters or operations for each generated coefficient. The following examples illustrate composite functions.

Function reuse: A node (210) can reuse its function to generate coefficients (213) through function composition (i.e., use composites of its function). For example, a univariate code with parameter α (e.g., see FIG. 4) and function g can generate coefficients (413) following the sequence $(g(α), g^2(α), g^3(α), \ldots)$ or, for increased diversity, $(1, g(α), g^2(α), g^3(α), \ldots)$, where $g^2(α)=g(g(α))$.

Multiple parameters: A node can alternate among a set of parameters while moving to higher-order composites of a function. For example, a node with function g and parameter set {α, κ} (e.g., see FIG. 7) can use the sequence of coefficients $(1, g(α), g(κ), g^2(α), g^2(κ), g^3(α), g^3(κ), \ldots)$ as its coefficients (713).

Multiple functions: A node function can be defined through composites of multiple sub-functions. For example, a univariate code with parameter α (e.g., see FIG. 4) can generate coefficients (413) following the sequence $(1, g(α), g'(α), g^2(α), g'^2(α), g^3(α), g'^3(α), \ldots)$, where g and g' are distinct sub-functions. A node function can also be defined through alternation between multiple sub-function compositions. For example, a univariate code with parameter α (e.g., see FIG. 4) can generate coefficients (413) following the sequence $(1, g(α), g'(g(α)), g(g'(g(α))), \ldots)$. Codes can combine elements of two or more of the methods above.

Example of Thrifty Code in Multi-Hop Network

Figure 9:
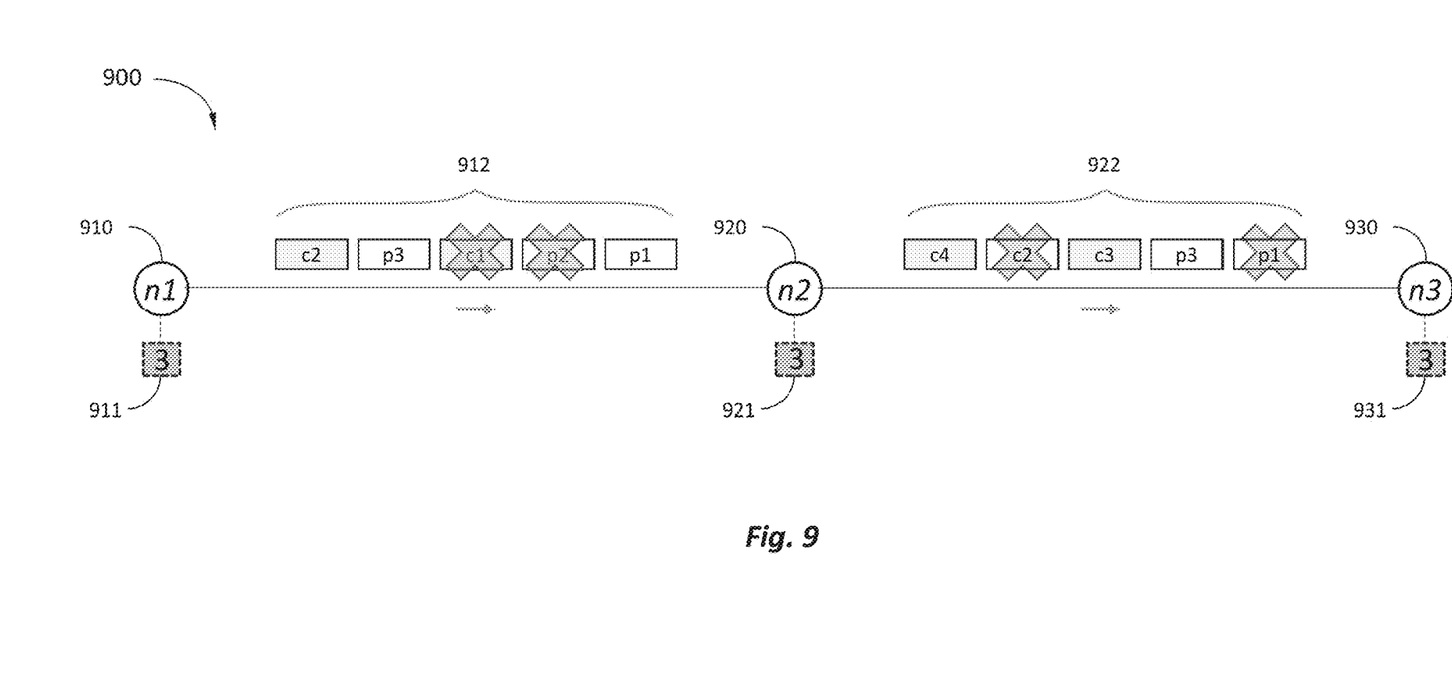
FIG. 9 shows an example of a thrifty code in a network.

Multi-hop networks are networks where data units need to traverse more than one hop from source to destination. Line, or daisy-chain, networks, are typically used to illustrate multi-hop performance. FIG. 9 shows a line network (900) formed by three nodes: a source node n1 (910), an intermediate node n2 (920), and a destination node n3 (930). The same parameter α=3 was programmed in the memories of n1 (911), n2 (921), and n3 (931), where operations are conducted in field $F_{32}$ (i.e., q=32).

When performing linear coding, all nodes select coefficients C(i) using the following function:

C(1)=1

C(i+1)={C(i)+α}[q],         $g_3$:

where i>=1 is an index and [.] is the modulo operator.

Code: The function therefore cycles in a round robin fashion across the finite field following the sequence {1, α, 2α, 3α, . . . } where α=3. The sequence is not interrupted for each new coded packet.

Scenario and Transmission Policy: A 3-packet block containing packets (p1, p2, p3) is to be transmitted from n1 to n3. On each link two packets out of five are lost due to fluctuations in channel quality. To protect the transmitted packets, redundancy packets are inserted after the second and third transmitted packets (code rate=3/5).

Figure 10:
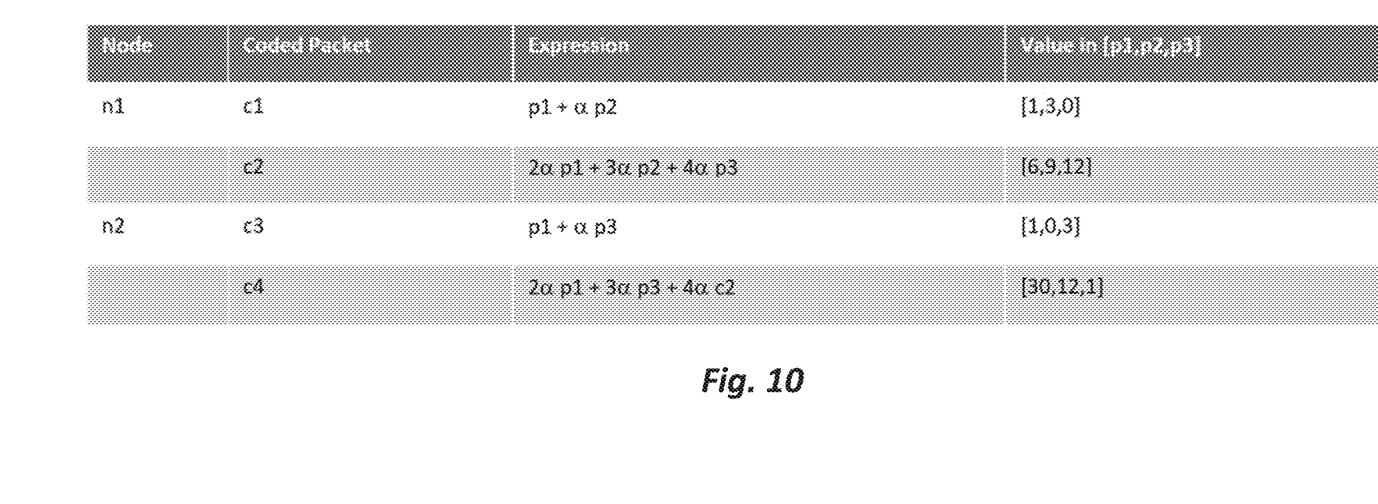
FIG. 10 shows a sequence of packets transmitted by some of the nodes of FIG. 9.

FIG. 10 shows the sequence of uncoded and coded packets transmitted by nodes n1 (912) and n2 (922).

Node n1 generates packets c1 and c2 from input packets p1, p2, and p3 and sends the five packets (912) according the transmission policy described above. Packets p2 and c1 are subsequently lost (912).

Node n2 receives packets p1, p3 and c2 (912). It uses those three input packets to generate and transmit two additional coded packets, c3 and c4, according to the same transmission policy. Node n2 hence transmits the packet sequence {p1, p3, c3, c2, c4} (912). Packets p1 and c2 are subsequently lost (922). Node n3 receives three of the five packets transmitted by n2 (922).

The table in FIG. 10 displays the coefficients of all coded packets in the scenario of FIG. 9, where any packet is represented by a triplet in $F_{32}$ [a, b, c] representing the linear combination L=ap1+bp2+cp3. The three packets received at the destination are (p3, c3, c4)=([0,0,1], [1,0,3], [30,12,1]), three independent combinations that enable the decoding of the three original packets. This illustrates that a thrifty code can successfully produce linear independence in intra-flow communications.

Increasing Code Diversity and Robustness

Multiple methods can be applied to increase the code diversity (i.e., reduce the likelihood of receiving linearly dependent packets at the receiver). Here are some examples:

Fractions: Packets to be encoded are divided into two subsets: a fixed fraction f of packets use the α parameter as a coefficient, while the remaining 1-f use 1. This is the method described by Lee but applied in an intra-flow setting. In the context of this application, the fraction f would be part of the function definition. The determination of whether a packet is to be assigned coefficient α or 1 may be carried out using non-probabilistic methods (e.g., assigning the coefficient based on the permanent updating of a floating fraction).

Fractions and functions: A fixed fraction f of packets to be encoded are assigned g(α), while the remaining 1-f are assigned g'(a).

Node Functions: Disseminate/program a single parameter/coefficient and multiple functions. Each node or group of nodes applies a different function to the coefficient. This is mentioned in the discussion of FIG. 8. Other node characteristics (e.g., network address) may also be used as an additional parameter to contribute diversity to the generated coefficients.

The examples set forth above are provided to those of ordinary skill in the art as a complete disclosure and description of how to make and use the embodiments of the disclosure, and are not intended to limit the scope of what the inventor/inventors regard as their disclosure.

Modifications of the above-described modes for carrying out the methods and systems herein disclosed that are obvious to persons of skill in the art are intended to be within the scope of the following claims. All patents and publications mentioned in the specification are indicative of the levels of skill of those skilled in the art to which the disclosure pertains. All references cited in this disclosure are incorporated by reference to the same extent as if each reference had been incorporated by reference in its entirety individually.

It is to be understood that the disclosure is not limited to particular methods or systems, which can, of course, vary. It is also to be understood that the terminology used herein is for the purpose of describing particular embodiments only, and is not intended to be limiting. As used in this specification and the appended claims, the singular forms "a," "an," and "the" include plural referents unless the content clearly dictates otherwise. The term "plurality" includes two or more referents unless the content clearly dictates otherwise. Unless defined otherwise, all technical and scientific terms used herein have the same meaning as commonly understood by one of ordinary skill in the art to which the disclosure pertains.

The invention claimed is:

1. A network node configured to communicate with other network nodes, the network node comprising:
   a receiver for receiving input packets;
   local node memory where one or more parameters for coding are stored;
   an encoder for creating coded packets from the input packets using one or more coefficients of a linear network coding, wherein each of the one or more coefficients of the linear network coding is generated at the network node via a pre-determined function of the one or more parameters that is locally selectable at the network node without coordination with the other network nodes; and
   a transmitter to transmit the coded packets,
   wherein
   the one or more parameters comprise a parameter α that is a member of a finite field $F_q$, q being a field size of the finite field $F_q$, and
   the pre-determined function is a function used by the encoder to generate an indexed sequence of coefficients C(i), such that:

for each integer i≥1, C(i)=i·α[q], [.] being the modulo operator.

2. The network node of claim 1, wherein the encoder is configured to create the coded packets from buffered copies of the input packets or previously coded packets.

3. The network node of claim 1, wherein the encoder is configured to use one or more previously generated and locally stored coefficients to compute the coefficient of the linear network coding.

4. The network node of claim 1, wherein
   the pre-determined function is locally selected by the network node at network setup or node discovery, or
   the one or more parameters are locally selected by the network node at the network setup or node discovery, selection being without coordination with the other network nodes.

5. The network node of claim 1, wherein the one or more parameters or the pre-determined function are initialized at network setup or node discovery by a network management unit, and are fixed thereafter, initialization being without coordination with the other network nodes.

6. The network node of claim 1, wherein the one or more parameters or the pre-determined function are locally pre-programmed and fixed at device manufacturing.

7. The network node of claim 1, wherein
   the one or more parameters or the pre-determined function are initialized at network setup or node discovery, initialization being without coordination with the other network nodes, and
   the one or more parameters or the pre-determined function are modified or updated by the network node or a network management unit.

8. The network node of claim 1, wherein the pre-determined function is a mathematical sequence.

9. The network node of claim 8, wherein
   the mathematical sequence is reinitialized for each coding operation, or
   the network node locally selects a different pre-determined function for each coding operation.

10. The network node of claim 8, wherein the mathematical sequence is reinitialized for each stream or batch of packets.

11. A plurality of network nodes in communication, the plurality of network nodes comprising:
    a first network node and a second network node, each according to claim 1,
    wherein the first network node is configured to communicate with the second network node.

12. The plurality of network nodes of claim 11, wherein the one or more parameters of the first network node are locally selectable without coordination with the second network node.

13. The network node of claim 1, wherein the pre-determined function is a composite of two or more sub-functions.

14. The network node of claim 1, wherein the pre-determined function is used by the encoder to generate the one or more coefficients as an indexed sequence of coefficients that is reused by the encoder for creating the coded packets.

15. The network node of claim 14, wherein coefficients of the one or more coefficients used in consecutive coded packets are assigned according to the indexed sequence of coefficients.

16. A method for processing packets input to a network node that is configured to communicate with other network nodes, the method comprising:

reading one or more parameters from a local memory;
determining whether a coded packet is required;
reusing the one or more parameters to generate one or more coefficients required for linear network coding; and
creating coded packets from input packets using the generated one or more coefficients,
wherein each of the one or more coefficients is generated at the network node from the one or more parameters through a pre-determined function that is locally selectable at the network node without coordination with the other network nodes,
wherein
the one or more parameters comprise a parameter $\alpha$ that is a member of a finite field $F_q$, q being a field size of the finite field $F_q$, and
the pre-determined function is a function used by the encoder to generate an indexed sequence of coefficients $C(i)$, such that:
for each integer $i \geq 1$, $C(i) = i \cdot \alpha [q]$, [.] being the modulo operator.

17. The method of claim 16, wherein the determining is based on an external request for a coded packet or on an internal factor.

18. A network node configured to communicate with other network nodes, the network node comprising:
a receiver for receiving input packets;
local node memory where one or more parameters for coding are stored;
an encoder for creating coded packets from the input packets using one or more coefficients of a linear network coding, wherein each coefficient of the linear network coding is generated at the network node via a pre-determined function of the one or more parameters that is locally selectable at the network node without coordination with the other network nodes; and
a transmitter to transmit the coded packets
wherein
the one or more parameters comprise parameters $\alpha$ and $\kappa$ that are members of a finite field $F_q$, q being a field size of the finite field $F_q$, and
the pre-determined function is a function used by the encoder to generate an indexed sequence of coefficients $C(i)$, such that:
for each integer $i \geq 1$, $C(i+1) = (C(i) + \kappa)[q]$, [.] being the modulo operator, and $C(1) = \alpha$.

19. A network node configured to communicate with other network nodes, the network node comprising:
a receiver for receiving input packets;
local node memory where one or more parameters for coding are stored;
an encoder for creating coded packets from the input packets using one or more coefficients of a linear network coding, wherein each coefficient of the linear network coding is generated at the network node via a pre-determined function of the one or more parameters that is locally selectable at the network node without coordination with the other network nodes; and
a transmitter to transmit the coded packets
wherein
the one or more parameters comprise a parameter $\alpha$ that is a member of a finite field $F_q$, q being a field size of the finite field $F_q$, and
the pre-determined function is a function used by the encoder to generate an indexed sequence of coefficients $C(i)$, such that:
for each integer $i \geq 0$, $C(i) = \alpha_i$.

20. A method for processing packets input to a network node that is configured to communicate with other network nodes, the method comprising:
reading one or more parameters from a local memory;
determining whether a coded packet is required;
reusing the one or more parameters to generate one or more coefficients required for linear network coding; and
creating coded packets from input packets using the generated one or more coefficients,
wherein each of the one or more coefficients is generated at the network node from the one or more parameters through a pre-determined function that is locally selectable at the network node without coordination with the other network nodes,
wherein
the one or more parameters comprise parameters $\alpha$ and $\kappa$ that are members of a finite field $F_q$, q being a field size of the finite field $F_q$, and
the pre-determined function is a function used by the encoder to generate an indexed sequence of coefficients $C(i)$, such that:
for each integer $i \geq 1$, $C(i+1) = (C(i) + \kappa)[q]$, [.] being the modulo operator, and $C(1) = \alpha$.

21. A method for processing packets input to a network node that is configured to communicate with other network nodes, the method comprising:
reading one or more parameters from a local memory;
determining whether a coded packet is required;
reusing the one or more parameters to generate one or more coefficients required for linear network coding; and
creating coded packets from input packets using the generated one or more coefficients,
wherein each of the one or more coefficients is generated at the network node from the one or more parameters through a pre-determined function that is locally selectable at the network node without coordination with the other network nodes,
wherein
the one or more parameters comprise a parameter $\alpha$ that is a member of a finite field $F_q$, q being a field size of the finite field $F_q$, and
the pre-determined function is a function used by the encoder to generate an indexed sequence of coefficients $C(i)$, such that:
for each integer $i \geq 0$, $C(i) = \alpha_i$.

* * * * *